United States Patent [19]
Ali et al.

[11] Patent Number: 4,971,892
[45] Date of Patent: Nov. 20, 1990

[54] HIGH SENSITIVITY PHOTOPOLYMERIZABLE COMPOSITION

[75] Inventors: Mohammad Z. Ali, Woodbury; Stanley C. Busman, Minneapolis, both of Minn.

[73] Assignee: Minnesota Mining and Manufacturing Company, St. Paul, Minn.

[21] Appl. No.: 426,662

[22] Filed: Oct. 26, 1989

Related U.S. Application Data

[63] Continuation-in-part of Ser. No. 275,516, Nov. 23, 1988, abandoned.

[51] Int. Cl.$^5$ .............................................. G03C 1/73
[52] U.S. Cl. .................................... 430/281; 430/786; 430/788; 430/715; 522/14; 522/25; 522/26; 522/94
[58] Field of Search ............... 430/281, 286, 577, 915, 430/288; 522/15, 16, 25, 26, 39, 14

[56] References Cited

U.S. PATENT DOCUMENTS

| | | | |
|---|---|---|---|
| 4,228,232 | 10/1980 | Rousseau | 430/281 |
| 4,278,751 | 7/1981 | Specht et al. | 430/281 |
| 4,505,793 | 3/1985 | Tamoto et al. | 430/281 |
| 4,755,450 | 7/1988 | Sanders et al. | 430/281 |
| 4,810,618 | 3/1989 | Koike et al. | 430/281 |
| 4,868,092 | 9/1989 | Kawabata et al. | 430/281 |
| 4,876,175 | 10/1989 | Chen et al. | 522/25 |

FOREIGN PATENT DOCUMENTS 0276016  1/1988  European Pat. Off. .

OTHER PUBLICATIONS

*The Theory of the Photographic Process*, 4th edition, T. H. James, Macmillan Publishing Co., Inc., pp. 194–207.
*The Theory of the Photographic Process*, 3rd edition, Mees and James, The macmillan Co., pp. 511–513, 518, 569, 592–595, 597.
*The Cyanine Dyes and Related Compounds*, F. M. Hamer, Interscience Publishers, p. 218.
"Photoinitiator Systems for Concurrent Radical and Cationic Polymerization", *Pure & Appl. Chem.*, vol. 60, No. 7, pp. 1033–1038.
79th Fall Conference, Japanese Society of Printing Science and Technology, pp. 81–84, 1987.

*Primary Examiner*—Marion C. McCamish
*Assistant Examiner*—Christopher D. RoDee
*Attorney, Agent, or Firm*—Donald M. Sell; Walter N. Kirn; Mark A. Litman

[57] ABSTRACT

A high speed visible light sensitive photopolymerizable composition useful for printing plates comprising
(a) at least one free radically polymerizable monomer having at least one ethylenically unsaturated group,
(b) an ethylenically unsaturated free radically polymerizable oligomer having carboxyl groups substituted thereon,
(c) a visible light sensitizing initiator system for free radical polymerization comprising an initiator selected from diaryl iodonium salts, halogenated triazines, and triaryl iodonium salts which are photoinitiating electron acceptor compounds having a reduction potential in the range 0.0 to $-1.5$ eV, spectrally sensititzed with at least one merocyanine sensitizer containing a constrained alkylamino group, preferably a julolidinyl group.

4 Claims, No Drawings

HIGH SENSITIVITY PHOTOPOLYMERIZABLE COMPOSITION

CROSS-REFERENCE TO RELATED CASES

This application is a continuation-in-part application of U.S. patent application Ser. No. 275,516, filed Nov. 23, 1988, now abandoned.

Patent application FN 40636USA9A, Ser. No. 34,065 filed 4/4/87 on sensitized iodonium salts for addition polymerization discloses and claims the use of sensitizers which are ketones containing julolidinyl moieties in the presence of electron donor compounds; inventors Ubel, Oxman, Palazzotto, and Ali. Patent Application FN 43024USA3A, filed the same date as this Application and titled "Sensitizers For Photopolymerizable Compositions" in the name of M. Z. Ali et al. describes sensitizers used in the present application.

BACKGROUND TO THE INVENTION

1. Field of Invention

This invention relates to sensitizers for photopolymerizable compositions. More particularly, this invention relates to high speed photopolymerizable printing plate compositions of ethylenically unsaturated monomers and oligomers by the use of merocyanine sensitizers in combination with photoinitiators such as iodonium salts and trichloromethyl-s-triazines.

2. Background of the Art

Photopolymerizable compositions have been used in photosensitive elements, such as printing plates, for a number of years. Most representative of the prior art are compositions disclosed in U.S. Pat. Nos. 3,218,167 and 3,887,450. These compositions are relatively slow, however, and must be exposed in the absence of oxygen. Radiation sensitive elements which are oxygen insensitive have been produced by overcoating the elements with an oxygen barrier layer as in U.S. Pat. No. 3,895,949. These elements nevertheless remain relatively slow and such compositions have been satisfactory only where contact printing of the plate and relatively long time exposures can be tolerated.

Radiation sensitive systems capable of initiating free radical polymerization upon absorption of radiation are well known in the art, such as Free-Radical Chemistry, D. C. Nonhebel and J. C. Walton, University Press (1974). Suitable free radical generators can be selected from many classes of organic compounds including, for example, organic peroxides, azo compounds, aromatic diazonium salts, aromatic iodonium salts, aromatic sulfonium salts, aromatic phosphonium salts, quinone, benzophenones, nitroso compounds, acyl halides, aryl halides, hydrazones, mercaptocompounds, pyrylium compounds, triarylimidazoles, biimidazoles, haloalkyltriazines, etc. These materials, generally, must have photosensitizers.

Additional reference in the art to free radical photoinitiator system for ethlyenically unsaturated compounds are included in U.S. Pat. No. 3,887,450 (e.g.-,column 4), U.S. Pat. No. 3,895,949 (e.g., column 7),and U.S. Pat. No. 4,043,810. Preferred initiators are the onium salts as disclosed in U.S. Pat. Nos. 3,729,313, 4,058,400 and 4,058,401. Other desirable initiators are halotriazines as disclosed in U.S. Pat. No. 3,775,113 and Biimidazoles disclosed in U.S. patent application Ser. No. 824,733, filed Aug. 15, 1979 and U.S. Pat. No. 4,311,783. These references also disclose sensitizers therein. A further reference to photoinitiator systems is "Light Sensitive Systems," J. Kosar, 1965, J. Wiley and Sons, Inc. especially Chapter 5.

Photopolymerizable compositions with higher sensitivity are required for applications such as projection printing plates and laser addressable printing plates. For these applications and particularly for laser addressable printing plates, high speed is essential to keep the exposure time short. It is also important to be able to use low intensity lasers, which are low cost and more reliable than the high intensity lasers. For these reasons, various studies are found in the art directed towards improving the sensitivity of photopolymerizable compositions. Some of the representative patents which disclose high speed photopolymerizable compositions are U.S. Pat. No. 4,228,232 (3M); U.S. Pat. No. 4,594,310 (Mitsubishi Chem Ind KK); U.S. Pat. No. 4,259,432 (Fuji Photo Film); U.S. Pat. Nos. 4,162,162, 3,871,885 and 4,555,473 (Dupont); U.S. Pat. No. 4,147,552 (Eastman Kodak) and European Patent Nos. 109,291 (Fuji Photo Film) and 196,561 (Nippon Oils and Fats) and Belgium Patent No. 897,694 (Nippon Oils and Fats).

Although some of these photopolymerizable compositions exhibit high sensitivity ($<1.0$ mj/cm$^2$) in the UV region, they have lower sensitivity ($>2.0$ mj/cm$^2$) at visible wavelengths. The lower sensitivity in the visible region of the spectrum restricts the utility of these photopolymerizable compositions. For example, commercially available low cost lasers such as argon ion lasers (water-cooled and air-cooled) have strong light output at 488 nm and 514 nm which the UV sensitive materials cannot properly utilize.

This invention shows how highly sensitive aqueous developable photopolymerizable printing plate compositions which can be imaged by visible light projection exposure or by scanning with low powered visible light emitting lasers (such as argon-ion lasers) can be made by employing very efficiently sensitized free radical initiator systems, together with highly reactive free radically polymerizable materials (monomers and oligomers) and oxygen barrier layers.

U.S. Pat. No. 4,228,232 (3M) describes aqueous developable photopolymerizable compositions containing unsaturated oligomers for applications such as printing plates. The initiators for these compositions are sensitized iodonium salt and are sensitive to visible light. These compositions can be imaged by exposing with a water cooled argon ion laser (488 nm) and a photo sensitivity of up to 1.8 mj/cm$^2$ for 5 solid steps, or sensitivity of 0.32 mj/cm$^2$ for 1 solid step ( 2 density, step wedge) was obtained.

European patent No. 195,561 describes a photosensitive lithographic printing plate which can be imaged by Argon-Ion Laser. The composition contains a polymerizable compound, an organic peroxide and a compound absorbing visible light. In a similar patent (BE 897,696), a photopolymer composition with sensitivity threshold of at least 480 ergs/cm$^2$ at a wavelength of 488 nm is described.

Compounds capable of generating free radicals upon exposure to light, which initiates polymerization, are well known in the art ("Photopolymerization of Surface Coatings", C. G. Roffey, Wiley-Interscience Publications, 1982, pages 67–136). However, the utility of many of these photoinitiators or photoinitiator systems are quite limited because the initiators are activatible primarily in the ultraviolet region of the spectrum. For example, iodonium salt photoinitiators are known to absorb ultraviolet light only at wavelengths below about 300 nm, and trichloromethyl-s-triazines absorbs light below 350 nm.

Various investigations have been carried out in order to broaden the spectral response of photoinitiators. To achieve this, researchers have added compounds which absorb incident light more efficiently and then activate the photoinitiator to produce free radicals. These compounds which absorb the incident light more efficiently are generally termed as sensitizers or photosensitizers.

U.S. Pat. No. 3,729,313 describes sensitizers for diaryliodonium compounds for free radical polymerization. Sensitizers are included from the class of diphenylmethane, xanthane, acridine, methine and polymethine, thiazole, thiazine, azine, aminoketone, porphyrin, colored aromatic polycyclic hydrocarbons, p-substituted aminostyryl compounds and aminotriaryl methanes.

Japanese patent J6 0088005 (Agency of Ind. Sci. Tech.) discloses 3-ketocoumarin compounds as sensitizers for diaryliodonium compounds.

U.S. Pat. No. 4,250,053 describes sensitizers for Iodonium salts and particularly 1,3-diaryl-1-pyrazolines for free radical polymerization.

U.S. Pat. No. 3,617,288 describes sensitizers for halogenated hydrocarbon compounds.

U.S. Pat. No. 4,505,793 describes ketocoumarin sensitizers for halogenated triazines for free radical polymerization.

While the aforementioned compositions have provided improved photospeed compared to the unsensitized system, there is still a need for a more sensitive photopolymer composition. High photospeed is particularly desirable for projection exposure imaging and imaging by laser scanning techniques.

U.S. Pat. Nos. 4,162,162, 4,268,667, 4,351,893 and European Patent No. 127,762 disclose sensitizers containing constrained amino-ketone groups for bi-imidazole initiators in addition polymerization. U.S. Pat. No. 4,505,793 discloses constrained coumarin sensitizers for triazine initiators. Amino group containing coumarins and constrained coumarins are also disclosed in U.S. Pat. Nos. 4,278,751, 4,147,552, 4,366,228 and G.B. Patent No. 2,083,832 for use as triplet sensitizers for cyclo-addition reactions or for use as sensitizers for radical polymerization in combination with arylaminoacetic acids. References of these compounds are also found in Polym. Eng. Sci. 1983, 23, 1022–1024. This article mentions the utility of aminoketocoumarin compounds as sensitizers with alkoxypyridinium salts. Photoreactions of coumarin compounds are also mentioned in J. Org. Chem. 1984, 49, 2705–2708. U.S. Pat. No. 4,250,053 teaches constrained coumarin as a sensitizer of iodonium salt for cationic polymerization.

SUMMARY OF THE INVENTION

The present invention relates to a photopolymerizable composition exhibiting higher photosensitivity than compositions known in the art, and furthermore capable of being used with visible light.

The invention further relates to a photosensitive curable compositions having extremely high sensitivity to a wide wavelength range including the visible light range and a photosensitive curable composition which has high sensitivity particularly to the visible light output lines of mercury lamps useful for projection exposure imaging.

Another aspect of this invention is to provide a photosensitive lithographic plate composition which has extremely high sensitivity particularly to the output lines of visible laser lights and does not show reciprocity law failure even when exposed to a high illumination light for an extremely short time during the high speed scanning exposure process.

The present invention therefore, relates to a photopolymerizable composition comprising 1. at least one free radically polymerizable monomer having at least one ethylenically unsaturated group,
2. an ethylenically unsaturated free radically polymerizable oligomer having carboxyl groups substituted thereon,
3. a polymeric binder, and
4. a photosensitive initiator system for free radical polymerization comprising an initiator such as triaryl sulfonium salts, diaryl iodonium salts or halogenated triazines spectrically sensitized with merocyanine sensitizers containing a constrained alkylamino group.

The invention also envisages a printing plate or resist imaging assembly comprising a substrate carrying a layer of the photopolymerizable composition and optionally carrying an oxygen barrier overcoat layer (e.g., polyvinyl alcohol) coated over the photopolymerizable layer.

A constrained alkylamino group is defined here as a saturated heterocyclic structure containing at least one nitrogen atom which is directly attached to an existing aromatic ring of the merocyanine; other nitrogens in the heterocyclic structure optionally may be attached to the aromatic ring. The heterocyclic structure may form a condensed ring structure with the aromatic ring or alternatively can be a pyrrolidinyl or diazolyl substituent on the aromatic ring of the merocyanine, with the proviso that when the merocyanine dye is a ketocoumarin a constrained alkylamino group is attached to the ketocoumarin moiety. Such constrained alkylamino groups are chosen from the class of monocyclic, bicyclic or polycyclic amino compounds, such as pyrrolidine, piperidine, julolidine, diazines, diazoles, etc. Particularly preferred is the constrained alkylamino group which with an aromatic group of the merocyanine forms a julolidine group; this generally imparts 2–4 times higher speed compared with non-constrained alkylamino groups.

Selection of the structure of the merocyanine sensitizer moiety can provide high sensitivity to visible light of a desired wavelength range.

DETAILED DESCRIPTION OF THE INVENTION

The photosensitive lithographic printing plates of this invention provide extremely high sensitivity in the visible region of the spectrum and particularly for the argon-ion laser emission lines. This high sensitivity is attained by the use of sensitizers of the class of constrained amino ketones. Presensitized aqueous developable printing plates or aqueous and solvent developable resist systems with a sensitivity threshold less than 0.1 mJ/cm$^2$ at 488 nm (argon-ion laser exposure), and with good storage stability and long press life are obtained. None of the prior art articles achieves all of these desirable properties in a single construction.

Higher sensitivity together with the maintainance of other desirable properties of a high performance resist imaging system allows utilization of commercially available low cost visible lasers (such as argon-ion lasers) and enhances potential commercialization of a laser addressable proofing material or printing plate.

High sensitivity photoinitiator systems for the present invention are sensitized iodonium salts or triazines containing constrained amino ketone sensitizers (described in copending U.S. patent application Ser. No. 34,065 filed on Apr. 4, 1987, in the name of Ubel, Oxman, Palazzotto, and Ali, bearing Attorney's Docket No. 40636 USA 9A). As a result of extensive investigations, we have found that higher sensitivity photopolymerizable compositions can be obtained if the photopolymerization initiator comprises (A) at least one photoinitiator compound selected from triaryl sulfonium salts, diaryliodonium salts, halogenated triazines and similar free-radical photoinitiator compounds having reduction potential of 0 to −1.5 ev vs SCE, (B) a constrained alkylamino group containing merocyanine sensitizer having an oxidation potential between 0.5 to 2.0 ev vs Saturated Calomel Electrode (SCE), The improved photoinitiator system of the present invention comprises a free radical photoinitiator having a reduction potential in the range of 0.0 to −1.5 electron Volts and at least one merocyanine sensitizer containing a constrained alkylamino group. These photoinitiator systems are very effectively used in compositions containing ingredients with ethylenically unsaturated groups on monomers, oligomers, and/or polymers.

The merocyanine sensitizing dye compounds of the present invention are arylidine aryl ketones, bis-(p-aminophenyl-α,β-unsaturated)-ketones, aminoketones, coumarins (ketocoumarins) and other merocyanine sensitizers, containing constrained alkylamino groups. Preferred merocyanine sensitizers are selected from those represented by general formulae 1, 2, 3, and 4

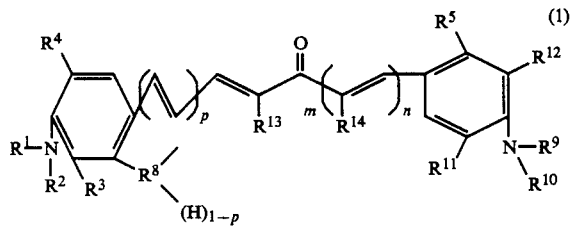

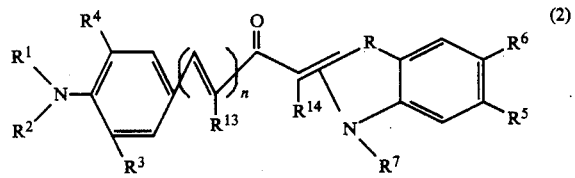

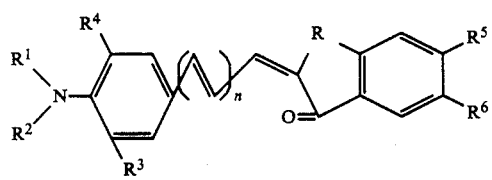

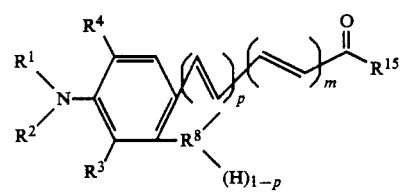

where $R^1$, $R^2$ $R^3$ and $R^4$, are selected from hydrogen, and alkyl groups containing 1 to 10 carbon atoms, and at least one pair of adjacent substituents selected from $R^1$, $R^2$, $R^3$, and $R^4$ together from a 5 or 6 membered heterocyclic ring, provided that if $R^1$ and $R^2$ are selected as the adjacent substituents then the resultant ring is 5 membered (the rings condensed with one of the aromatic rings preferably form a julolidine moiety); $R^9$, $R^{10}$, $R^{11}$, and $R^{12}$ are selected from hydrogen, and alkyl groups containing 1 to 10 carbon atoms, or one or more adjacent pairs of substituents selected from $R^9$, $R^{10}$, $R^{11}$, $R^{12}$ may together form one or more 5 or 6 membered heterocyclic rings provided that if $R^9$ and $R^{10}$ are selected as the adjacent substituents then the resultant ring is 5 membered, $R^5$ and $R^6$ are each independently hydrogen, an alkoxy group containing from 1 to 6 carbon atoms, an alkyl group from 1 to 4 carbon atoms, a hydroxy group, a halogen atom, a nitro group, an alkyl sulfide group, or an alkylamino group, $R^7$ is an alkyl group containing 1–10 carbon atoms, $R^8$ is an alkyl group from 1–3 carbon atoms (preferably methylene), or a —OC═O group to form a coumarin ring; $R^{13}$, $R^{14}$ are independently selected from hydrogen, alkyl groups of 1 to 10 carbon atoms, and —CO$_2$R$^7$, or $R^{13}$ and $R^{14}$ together complete a 5, 6, or 7 membered ring, $R^{15}$ is selected from alkyl containing 1 to 5 carbon atoms, alkoxy containing 1 to 5 carbon atoms, Ar$^3$—, and Ar$^3$O—, where Ar$^3$ is selected from phenyl, substituted phenyl, naphthyl, and substituted naphthyl, p is an integer selected from 0 and 1 (with the proviso that when p is 0, the remainder of the methine chain is para to the amine group and the unsatisfied valence meta to the amine group may be H or lower alkyl), m and n are integers independently selected from 0, 1, 2, and 3 providing that the sum of m and p is not greater than 3, R is an alkyl or substituted alkyl group, or a heteroatom such as S, O, Se, or =NR$^7$.

Examples of arylidine and arylketone compounds include 2-(9'-julolidine)-1-indanone,
2-(9'-julolidine)-5,6-dimethoxy-1-indanone,
2-(4'-N-ethyltetrahydroquinoline)-1-indanone,
2-(4'-N-ethyl-indoline)-1-indanone
2-(4-N-ethyl-indoline)-5,6-dimethoxy-1-indanone,
2-(4'-N-ethyl-tetrahydroquinoline)-5,6-dimethoxy-1-indanone
2-(4'-pyrrolidinobenzylidine)-1-indanone
Bis-(p-aminophenyl-A,B,-unsaturated) ketone compounds include
2,6-bis(9'-julolidine) cyclohexanone
2,5-bis(9'-julolidine)-cyclopentanone
As well as ketones of the formula

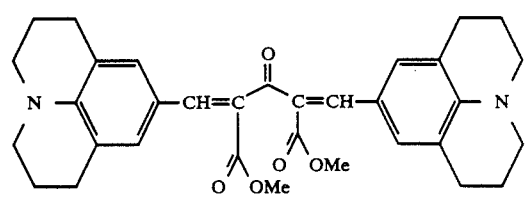

Ketocoumarin compounds include

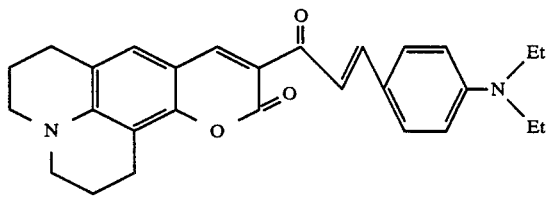

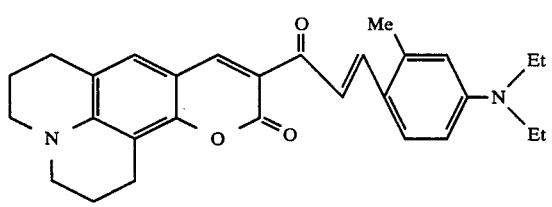

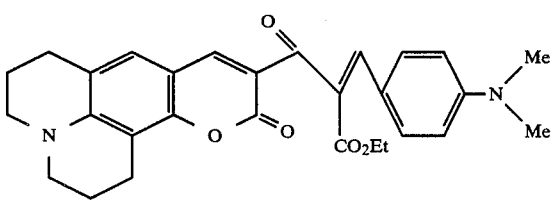

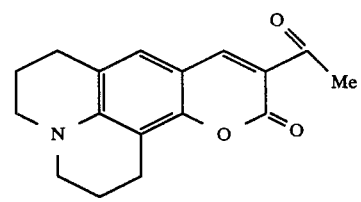

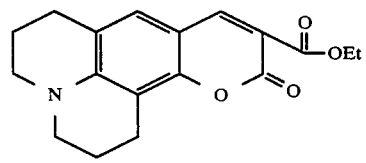

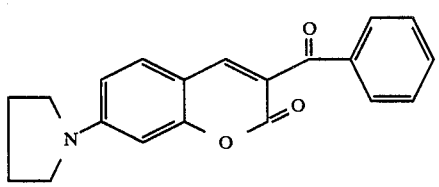

Aromatic iodonium salts which can be sensitized in accordance with this invention are disclosed in U.S. Pat. No. 4,250,053 and have the general formula:

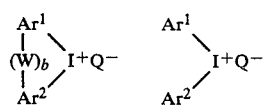

wherein

Ar$^1$ and Ar$^2$ are aromatic groups having from 4 to 20 carbon atoms and are preferably selected from phenyl, naphthyl, thienyl, furanyl and pyrazolyl groups, W is selected from

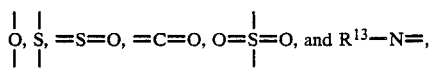

where R$^{13}$ is aryl of 6 to 20 carbon atoms, acyl of 2 to 20 carbon atoms, a single bond, or =CR$^{14}$R$^{15}$ in which R$^{13}$ and R$^{14}$ are selected from hydrogen, alkyl groups of 1 to 4 carbon atoms, b is zero or one, Q is any anion, preferably a halogen-containing complex anion selected from tetraborate, hexafluorophosphate, hexafluoroarsenate, and hexafluoroantimonate.

Halogenated hydrocarbon compounds including triazines which can be sensitized in accordance with this invention are disclosed in U.S. Pat. No. 3,617,288. Halogenated triazine compounds substituted by at least one trihalomethyl group are disclosed for example in U.S Pat. No. 4,505,793 and are represented by the general formula:

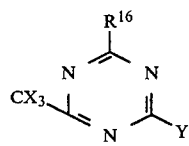

wherein,

X is a halogen atom (preferably chlorine or bromine),

Y is —CX$_3$, —NH$_2$, —NHR$^{15}$, —NR$^{15}$$_2$, or —OR$^{15}$, wherein R$^{15}$ is an alkyl group of 1 to 4 carbon atoms or an aryl group containing 6 to 10 carbon atoms, and R$^{16}$ is —CX$_3$, an alkyl group of 1 to 12 carbon atoms, a substituted or unsubstituted aryl group of 6 to 12 carbon atoms, an alkenyl group of 2 to 12 carbon atoms, or a substituted or unsubstituted aralkenyl group containing from 8 to 20 carbon atoms.

Any convenient source of actinic radiation providing wavelengths in the region of the spectrum that overlap the absorption bands of the spectral sensitizer dyes can be used to activate the photopolymerization initiator compositions for radical formation, image formation and photopolymerization initiation. The light can be natural or artificial, monochromatic or polychromatic, incoherent or coherent, and for high efficiency should correspond closely in wavelengths to the sensitizers principal absorption bands and should be sufficiently intense to activate a substantial portion of the sensitizer compound.

Conventional light sources include fluorescent lamps, mercury, metal additive, pulsed xenon, and arc lamps providing narrow or broad spectral bands centered near 405, 436 and 546 nm (Hg) wavelengths. Coherent light sources are pulsed xenon chloride, argon ion, and ionized neon lasers. Visible emitting cathode ray tubes widely used in printout systems for writing on photosensitive materials are also useful with the subject compositions.

One of the critical materials in the photopolymerizable compositions of the present invention is the monomer. This material is a free radically polymerizable monomer having one or more ethylenically unsaturated groups, and preferably 2 to 4 ethylenically unsaturated groups such as acrylate, methacrylate, vinyl and allyl. Preferred are compounds having multiple acrylate and methacrylate groups, e.g., acrylic esters of low molecular weight polyols, such as trimethylolpropanetriacrylate, pentaerythritol tetraacrylate, and triacrylate, etc. Preferably these monomers have a molecular weight of less then 2,000 and more preferably less then 1,000.

Suitable free radical polymerizable monomers useful in the compositions of the invention are well known and listed in many patents, e.g., U.S. Pat. Nos. 3,895,949 and 4,037,021. Preferred monomers are the polyacrylates and polymethacrylate esters of alkanepolyols, e.g., pentaerythritol tetraacrylate, tris(2-acryloxyethyl)isocyanurate, 2-acetoxyethyl methacrylate, tetrahydrofurfurylmethacrylate, 1-aza-5-acryloxymethyl-3,7-dioxabicyclo[3,0,0]octane (ADOZ), bis[4-(2-acryloxyethyl)phenyl]dimethylmethane, diacetone acrylamide, acrylamidoethyl methacrylate.

Free radical polymerizable oligomers with pendant carboxyl groups are known in the art. Some representative examples are U.S. Pat. Nos. 3,887,450, 3,448,089, 4,162,274, 4,228,232 and U.S. patent application Ser. No. 151,879, filed on Feb. 3, 1988. The most preferred oligomers are found in the latter two references.

The photopolymerizable composition of the invention containing the above-described ethylenic compound and photosensitizer-initiator system may further contain, if desired, known additives such as a binder, a thermal polymerization inhibitor, a plasticizer, a coloring agent and a surface lubricant (U.S. Pat. No. 4,228,232). Also particularly favored is the use of an oxygen barrier layer coated above the photosensitive layer.

Oxygen barrier layers are well known in the art (U.S. Pat. No. 3,458,311). Preferred polymers on the oxygen barrier layers of the present invention are polyvinylalcohol, carboxymethyl cellulose or mixtures thereof. Polymer top coat layers used in these constructions must be dissolvable in aqueous alkaline solution of pH 8-13 such as the aqueous developers of the examples.

Generally, the photosensitive compositions of the invention are prepared by mixing the components in a low boiling polar solvent (boiling at less than about 150° C. at atmospheric pressure) that is not reactive with carboxyl groups or ethylenically unsaturated groups, such as methanol, ethanol, propanol, acetone, methylethylketone, tetrahydrofuran or mixtures thereof. There may even be water present although less than 50% by weight of water in the solvent is preferred. The amount of solvent used (generally 0 to 98% by weight, preferably 10 to 96% by weight and in lithographic application 85 to 95% by weight solvent is most preferred) depends upon the desired viscosity and desired coating thickness. It is often desirable to add a surfactant or coating aid, but these aids, including the solvent are not functionally required for practice of the invention, but are merely better modes of practice. 0.001 to 2% of surfactant, particularly silicone or fluorocarbon surfactants will usually be sufficient.

The coating weight of the compositions of the present invention is usually 0.3 to 9 g/m$^2$, preferably 0.5 to 5 g/m$^2$, and most preferably 0.8 to 2.4 g/m$^2$. Suitable substrates include resin coated paper, various transparent or opaque plastic sheet or film, metal sheets and foils (preferably aluminum substrates that have been grained and anodized.) The coated substrates must be maintained in the absence of light unless the element is sensitized to a narrow range of the electromagnetic spectrum outside the range of nominal light and the element is provided with a filter layer which excludes normal visible light.

The preferred utility of the photopolymerizable compositions of the present invention is as a presensitized plate for use in printing operations such as in the formation of lithographic plates. This structure comprises a grained and anodized aluminum substrate coated with from 0.3 to 9 g/m$^2$ of the composition of the present invention. Grained substrates are surfaces which have been textured or roughened. This treatment is well known in the art and can be effected by brush graining (roughening with an abrasive material), chemical etching, or electrochemical graining. Anodizing is the well known anodic oxidation of metal surfaces.

The free radically polymerizable compound used herein is a compound containing at least one ethylenically unsaturated double bond and this may be a monomer, a prepolymer, i.e., a dimer a trimer and other oligomers, a mixture thereof, a polymer, or a copolymer. Suitable examples and preferred monomers are listed in U.S. Pat. No. 4,228,232. Suitable examples and preferred oligomers are disclosed in U.S. Pat. No. 4,476,215. The photopolymerizable composition of the invention containing the above-described ethylenic compound and photosensitizer-initiator system may further contain, if desired, known additives such as a binder, a thermal polymerization inhibitor, a plasticizer, a coloring agent and a surface lubricant (U.S. Pat. No. 4,228,232).

The composition of the invention can be used for preparation of coatings for various substrates; however, adhesives, sealants, binders and rubbers can also be prepared from the composition of the invention. (These are described in U.S. Pat. No. 4,250,053, lines 10-18.)

The photopolymerizable composition may contain additives known in the art to alter the properties of the polymerized or cured product (U.S. Pat. No. 4,250,053 lines 19-24).

Photopolymerizable compositions using photopolymerization initiator compositions of the present invention are particularly useful in presensitized printing plates and color proofing systems. The increased speed of the compositions provided by the constrained sensitizers are particularly useful in projection speed and argon ion laser addressable printing plates and color proofing systems.

EXAMPLES

A. Preparation of Sensitizing Dye A.

A mixture of 1.5 g of Dye F and 1.3 g of 4-diethyl aminobenzaldehyde in 50 ml ethanol was heated until the reagents were dissolved. One ml of piperidine was added and the reaction mixture heated under reflux for 7 hr. The solution was allowed to cool to room temperature and then was further cooled in an ice-water bath. The precipitated red solid was filtered and the solid was washed by cold ethanol and water. Upon recrystallization from ethanol 0.9 g of red solid was obtained, having a melting point of 185°-186° C. and λmax of 504 nm in methanol.

B. Preparation of Sensitizing Dye R.

A solution of 1.0 g 4'-piperidinoacetophenone and 1.05 g of 9-julolidinecarboxaldehyde in 20 ml of ethanol was warmed until the reagents went into solution. Aqueous sodium hydroxide (25%, 1 ml) was then added and the reaction mixture was heated to reflux for 1 hr. The solution was cooled in an ice bath and the precipitated solid was filtered. The solid was washed with petroleum ether and water and was recrystallized from ethanol to yield 0.7 g of orange-red solid, with a melting point of 149°-150° C. and a λmax of 450 nm in methanol.

To test the effectiveness of the compounds as sensitizers with iodonium compounds in a photopolymerizable element, the following stock solution was prepared.

| Component | Amount |
|---|---|
| Pentaerythritol tetraacrylate | 4.3 g |
| Oligomer P-II, 61% in MEK (U.S. Pat. No. 4,228,232) | 5.6 g |
| Triethylamine | 0.3 g |
| n-propanol-water azeotrope (78:22, w/w) | 74.2 g |
| Pigment Red 48 (4.1% pigment and 8.2% poly(vinyl formal 12/85 in azeotrope) | 14.9 g |

To 5 g of the above formulation was added 2-6 mg of sensitizer, 20 mg of $Ph_2I^+PF_6^-$ (or tris-trichloromethyl-s-triazine). The solution was then coated with wire wound rods onto grained and anodized aluminum at coating weights of 100-200 mg/ft² and dried at 150° F. for 2 min. The plate was then top coated with 5% aqueous polyvinyl alcohol containing a small amount of inert surfactant (Triton X-100, 0.03%) as a coating aid and a coating weight of 100-200 mg/ft². The dried samples were exposed through a √2 density increment, 21 step Stouffers sensitivity guide for 2 sec. with a 16,000 foot candle tungsten light source at 10 inches (3M model 70 light source). The exposed plates were developed with an aqueous solution of 4% n-propanol, 2% sodium metasilicate and 0.06% Dowfax ™ 2AL surfactant (Dow Chemical Company). The Table shows the number of steps after exposure and development where the polymer was retained. The step values (solid) indicate the exposure level at which the developed image density can no longer be differentiated from the background and is believed to be cured to the desired level. Absolute sensitivity of many of the samples were also measured by exposing with an argon-ion laser (488 nm) or by exposing at the corresponding absorption maximum of the sensitizer with a one KW high-pressure mercury-xenon light source directed through a monochromator with a 20 nm band pass. The lamp output was measured by a radiometer. From the data in the table it is seen that the photosensitivity of photopolymer compositions are in general higher with sensitizers containing constrained julolidine group.

TABLE OF SENSITIZERS

| Sensitizer | Formula |
|---|---|
| A | (julolidine-coumarin with chalcone-N,N-diethylaniline structure) |
| B | (7-dimethylamino coumarin with chalcone-N,N-diethylaniline structure) |
| C | (7-dimethylamino coumarin with chalcone-N,N-dimethylaniline structure) |
| D | (julolidine-coumarin with chalcone-2-methyl-4-N,N-dimethylaniline structure) |
| E | (julolidine-coumarin with ethyl ester structure, $OC_2H_5$) |

TABLE OF SENSITIZERS-continued

| Sensitizer | Formula |
|---|---|
| F | (julolidine fused coumarin with =CH-C(COCH₃)=O acetyl substituent) |
| G | 7-(dimethylamino)coumarin with 3-(=CH-COCH₃) acetyl substituent |
| H | 2-(4-(diethylamino)benzylidene)indan-1-one |
| I | 2-(julolidin-ylmethylene)indan-1-one |
| J | 2-(2-methoxy-4-(diethylamino)benzylidene)indan-1-one |
| K | 2-(2,4-dimethoxy-4-(diethylamino)benzylidene)indan-1-one |
| L | 2-(2-methyl-4-(dimethylamino)benzylidene)indan-1-one |
| M | julolidine-coumarin with =CH-CO-C(CO₂CH₃)=CH-C₆H₄-N(CH₃)₂ substituent |

TABLE OF SENSITIZERS-continued

| Sensitizer | Formula |
|---|---|
| N | ![structure N] |
| O | ![structure O] |
| P | ![structure P] |
| Q | ![structure Q] |
| R | ![structure R] |

TABLE OF EXAMPLES

| Example | Sensitizer | λmax nm | Amount | Steps | Abs. Sensitivity (erg/cm$^2$) |
|---|---|---|---|---|---|
| 1 | A | 504 | 3 mg | 14 | 1400 (488 nm) |
| 2 | B | 480 | 3 mg | 13 | 2100 (488 nm) |
| 3 | C | 475 | 3 mg | 9 | 8000 (488 nm) |
| 4 | D | 490 | 3 mg | 13 | 1600 (488 nm) |
| 5 | E | 435 | 5 mg | 16 | 500 (435 nm) |
| 6 | F | 452 | 5 mg | 13 | — |
| 7 | G | 436 | 5 mg | 9 | — |
| 8 | H | 439 | 5 mg | 12 | |
| 9 | I | 460 | 5 mg | 15 | |
| 10 | J | 488 | 5 mg | 10 | |
| 11 | K | 427 | 5 mg | 12 | |
| 12 | L | 438 | 5 mg | 12 | |
| 13 | M | 465 | 3 mg | 12 | 2500 |
| 14 | N | 450 | 3 mg | 9 | — |
| 15 | O | 504 | 3 mg | 13 | 1600 |
| 16 | P | 470 | 3 mg | 11 | 3500 |
| 17 | Q | 450 | 3 mg | 12 | — |
| 18 | R | 450 | 5 mg | 13 | 1600 |

EXAMPLE 19

A solution was prepared (in parts by weight) from 2.06 parts of pentaerylthritol tetraacrylate (SR-295 from Sartomer Company), 2.74 parts of urethane oligomer similar to P-II (60% solution in MEK) U.S. Pat. No. 4,228,232 (contains free radically polymerizable olefinic groups with pendant carboxy groups), 0.10 parts triethylamine, 0.26 parts of diphenyliodonium hexafluorophosphate, 0.07 parts of ketocoumarin sensitizer

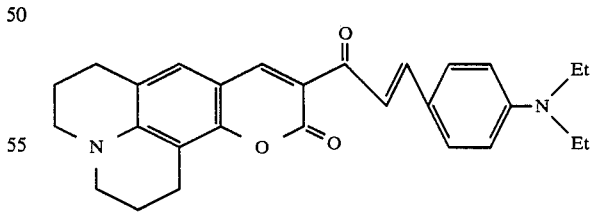

0.07 parts of 4-morpholinobenzaldehyde, 52,80 parts of n-propanol/water azeotrope (71.8% n-propanol and 28.2% water), 24.60 parts 1.5% Klucell M (Hercules Company) in water and 4.0 parts of millbase prepared from Sunfast Blue Pigment and Formvar 12/85 (Monsanto Company) in a ratio of 1:2 as 13.7% solids in n-propanol/water azeotrope.

The above solution was then coated with wire wound rods onto grained and anodized aluminum sheet at coating weights of 100–200 mg/ft$^2$ and dried at 150° F. for 2 min. The plate was then top coated with 5% aqueous polyvinyl alcohol containing 0.25% of $Ph_2I^+PF_6^-$ 0.03% Triton X-100 surfactant (Rohm and Haas Company) at a coating weight of 100-200 mg/ft$^2$ and dried at 150° F. for 2 min.

The plate was then exposed through a $\sqrt{2}$ density increment, 21 step Stouffer Sensitivity guide for 2 sec. with a 16,000 foot candle tungsten light source at 10 inches (3M Model 70 light source). The exposed plates were developed with an aqueous solution of 3% benzylalcohol, 2% sodium metasilicate and 0.06% Dowfax 2AL surfactant (Dow Chemical Company). The number of solid steps remained after exposure and development was 16. The step value (solid) indicates the exposure le el at which the developed image density can no longer be differentiated from the background and is believed to be cured to the desired level.

EXAMPLE 20

A solution was prepared (in parts by weight) from 2.30 parts of pentaerythriol tetraacrylate (SR-295 from Sartomer Company), 3.60 parts of oligomer (54% Solids in Butyl Acetate, example 8, U.S. Ser. No. 151,879, Feb. 3, 1988, which contains reactive olefin groups and carboxy groups), 36 parts of n-propanol/water azeotrope (71.8% n-propanol and 28.2% water), 2.4 g of Formvar 12/85 (Monsanto) in n-propanol/water azeotrope (12.7% solution) and 0.04 parts of triethyl amine To 23 parts of the above solution was added 0.03 parts of the sensitizer used in Example 1, and was mixed thoroughly. Three parts of a Millbase prepared from Sun fast Blue Pigment and Formvar 12/85 (Monsanto Co) in a ratio of 1:2 as 13.7% solids in n-propanol/water azeotrope was added, followed by 0.09 parts polyvinylpyrrolidone (PVP K90, MW 360,000), 0.12 parts diphenyliodonium hexafluorophosphate and 0.03 parts of 4-morpholino benzaldehyde.

The above solution was then coated, top coated, exposed and developed as in Example 19. The number of solid steps remaining after exposure and development was 17.

EXAMPLE 21

Coatings were prepared as in example 1. The coatings were exposed using an air-cooled argon ion laser at 488 nm and the exposed plates were developed as in example 1. Images could be formed at exposure value of 800 ergs/cm$^2$.

EXAMPLE 22

Coatings were prepared as in Example 19, except that sensitizer

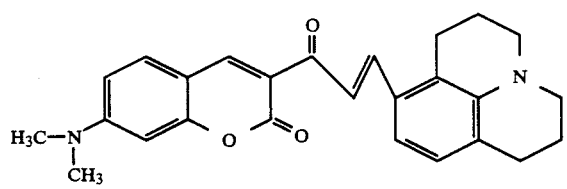

was used in place of the sensitizer of this invention used in Example 19. The sensitizer above is the dimethylamino analogue of the diethylamino used in Fuji patent U.S. Pat. No. 4,505,793. upon exposure and development as in Example 19, 11 solid steps remained compared with 16 solid steps obtained in Example 19, thus indicating that the Fuji sensitizer was a factor of about 6 slower than the sensitizer of the present invention.

Preferred merocyanine sensitizers of the present invention are those which contain at least one of the following central nuclei or segments

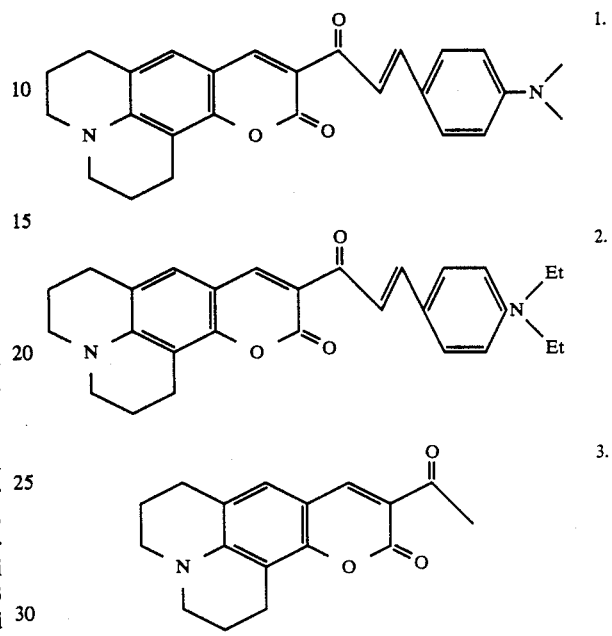

These central nuclei may contain substituent groups and ring structures which are common to merocyanine dyes. The amine nitrogens may, for example, bear alkyl group or phenyl group substituents, or be ring N atoms in cyclic structures such as those in merocyanine sensitizer I. The methine chain may be substituted with aliphatic groups including carboxylic esters (as in M), and the phenyl rings may be variously substituted as with halogen, alkoxy, alkyl, cyano, hydroxy and the like.

As is well understood in this technical area, a large degree of substitution is not only tolerated, but is often advisable. As simplifying the discussion and recitation of these groups, the terms "group" and "moiety" are used to differentiate between chemical species that allow for substitution or which may be substituted. For example, the phrase "alkyl group" is intended to include not only pure hydrocarbon alkyl chains such as methyl, ethyl, propyl, cyclohexyl, isooctyl, tert-butyl and the like, but also such alkyl chains bearing such conventional substituents in the art such as hydroxyl, alkoxy, phenyl, halo (F, Cl, Br, I), cyano, nitro, amino, etc. The phrase "alkyl moiety" on the other hand is limited to the inclusion of only pure hydrocarbon alkyl chains such as methyl, ethyl, propyl, cyclohexyl, isooctyl, tert-butyl, and the like.

What is claimed is:

1. A high sensitivity photopolymerizable composition comprising
   (a) at least one free radically polymerizable monomer having at least one ethylenically unsaturated group,
   (b) an ethylenically unsaturated free radically polymerizable oligomer having carboxyl groups substituted thereon, and
   (c) a photosensitive initiator system for free radical polymerization consisting essentially of an initiator which is an electron acceptor compound having a reduction potential in the range of 0.0 to −1.5 eV selected from the group consisting of halogenated triazines, diaryl iodonium salts, and triaryl sulfonium salts, spectrally sensitized with at least one merocyanine sensitizer containing a constrained alkylamino group, wherein said sensitizer has a segment or central nucleus of a formula selected from the group consisting of

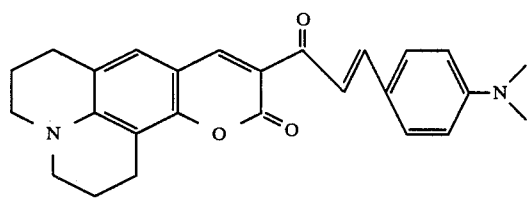

1.

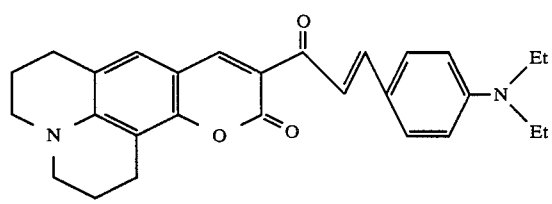

2.

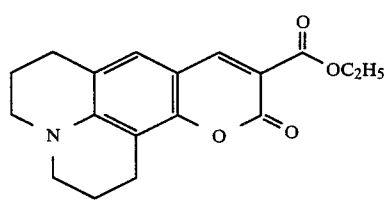

3.

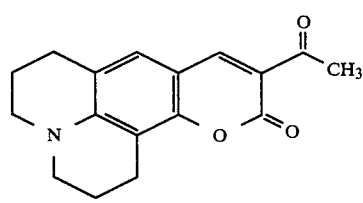

4.

and

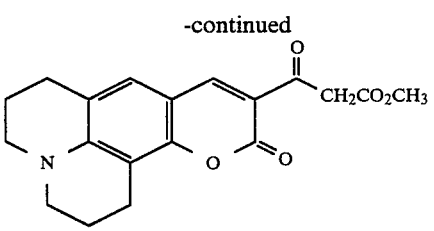

5.

2. A composition as recited in claim 1 wherein said sensitizer has a segment or central nucleus of a formula selected from the group consisting of

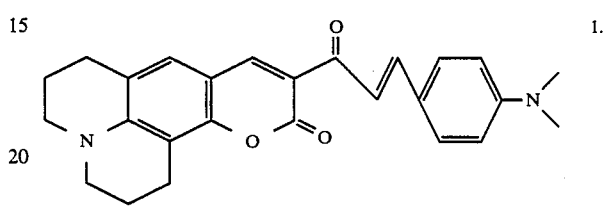

1.

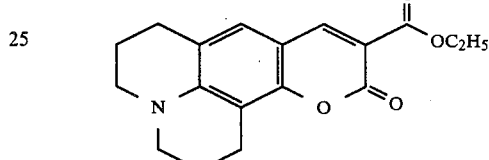

2.

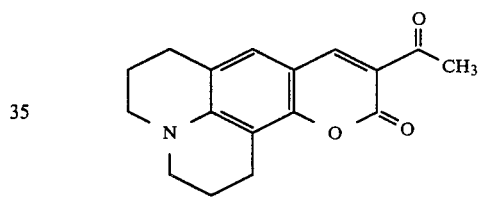

3.

and

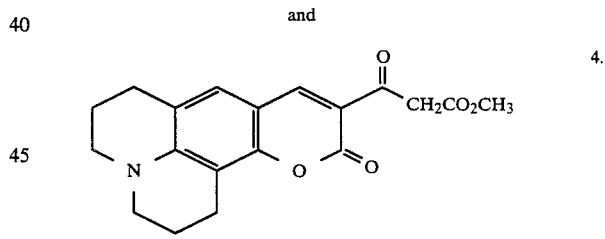

4.

3. A composition as recited in claim 1 wherein said sensitizer has an oxidation potential in the range of 0.5 to 2.0 eV.

4. A composition as recited in claim 1 wherein said initiator is selected from diaryl iodonium salts and halogenated triazines.

* * * * *